United States Patent
Ryu

(10) Patent No.: US 9,299,953 B2
(45) Date of Patent: Mar. 29, 2016

(54) FLAT PANEL DISPLAY DEVICE HAVING A SEALING STRUCTURE AND MANUFACTURING METHOD THEREOF

(71) Applicant: SAMSUNG DISPLAY CO., LTD., Yongin, Gyeonggi-Do (KR)

(72) Inventor: Ji-Hun Ryu, Yongin (KR)

(73) Assignee: Samsung Display Co., Ltd., Yongin-si (KR)

(*) Notice: Subject to any disclaimer, the term of this patent is extended or adjusted under 35 U.S.C. 154(b) by 0 days.

(21) Appl. No.: 14/014,314

(22) Filed: Aug. 29, 2013

(65) Prior Publication Data
US 2014/0312363 A1   Oct. 23, 2014

(30) Foreign Application Priority Data
Apr. 17, 2013 (KR) .................. 10-2013-0042420

(51) Int. Cl.
*H01L 27/15* (2006.01)
*H01L 51/52* (2006.01)
*H01L 33/56* (2010.01)

(52) U.S. Cl.
CPC .......... *H01L 51/5256* (2013.01); *H01L 27/156* (2013.01); *H01L 33/56* (2013.01); *H01L 2251/5338* (2013.01)

(58) Field of Classification Search
CPC ....... H01L 33/56; H01L 27/156; H01L 29/08; H05B 33/33
USPC ................. 438/26–30, 69, 82, 99, 149–166; 257/40, 88, 642–643, 759, 257/E51.001–E51.052, E25.008–E25.009; 349/187, 190
See application file for complete search history.

(56) References Cited

U.S. PATENT DOCUMENTS

| 8,389,983 | B2 | 3/2013 | Seo et al. | |
| 2007/0181872 | A1* | 8/2007 | Lee et al. | 257/40 |
| 2011/0198627 | A1* | 8/2011 | Maindron et al. | 257/88 |
| 2011/0291117 | A1* | 12/2011 | Kwack et al. | 257/88 |
| 2014/0017579 | A1* | 1/2014 | Hata | 429/408 |

FOREIGN PATENT DOCUMENTS

KR   10-2011-0067411 A   6/2011

* cited by examiner

*Primary Examiner* — Evan Pert
*Assistant Examiner* — Changhyun Yi
(74) *Attorney, Agent, or Firm* — Lewis Roca Rothgerber Christie LLP

(57) ABSTRACT

A flat panel display device and a manufacturing method thereof are provided. The flat panel display device includes: a display unit on a substrate; and a sealing structure on the substrate covering the display unit to seal the display unit, the sealing structure including at least one first layer including an inorganic material and at least one second layer including an organic material. The sealing structure includes at least one micro gap, and the micro gap includes an identification material including a fluorescent substance or a dye.

2 Claims, 2 Drawing Sheets

FLAT PANEL DISPLAY DEVICE HAVING A SEALING STRUCTURE AND MANUFACTURING METHOD THEREOF

CROSS-REFERENCE TO RELATED APPLICATION

This application claims priority to and the benefit of Korean Patent Application No. 10-2013-0042420, filed on Apr. 17, 2013, in the Korean Intellectual Property Office, the disclosure of which is incorporated herein in its entirety by reference.

BACKGROUND

1. Field

The present invention relates to a flat panel display device and a manufacturing method thereof.

2. Description of the Related Art

A flat panel display device, for example, an organic light-emitting display device, may be damaged due to exposure to an external environment, for example, due to exposure to oxygen, moisture, or the like. Therefore, a sealing structure may be used to seal an organic light-emitting unit from the external environment.

A light-emitting unit of a flat panel display device may be sealed with a thin film in order to have a thin profile and a flexible characteristic.

However, the thin film may be easily damaged, for example, when performing a process. The damage to the thin film may be minute, and thus, may not be visible. However, as time goes by, the damage to the thin film may form a penetration path for external moisture/oxygen, and thus, it may cause defects in the whole flat panel display device.

SUMMARY

Aspects of the present invention provide a flat panel display device, which detects defects of a sealing structure, which is formed as a thin film, to determine whether or not a defect has occurred in the flat panel display device, and a manufacturing method thereof.

According to an aspect of the present invention, there is provided a flat panel display device including: a display unit on a substrate; and a sealing structure on the substrate covering the display unit to seal the display unit, the sealing structure including: at least one first layer including an inorganic material; and at least one second layer including an organic material. Here, when the sealing structure includes at least one micro gap, the micro gap includes an identification material including a fluorescent substance or a dye.

The at least one micro gap may be in an outermost surface of the sealing structure.

The at least one first layer and the at least one second layer may be alternately stacked.

The at least one first layer may be at the outermost surface of the sealing structure.

The at least one second layer may be at the outermost surface of the sealing structure.

According to an aspect of the present invention, there is provided a method of manufacturing a flat panel display device, the method including: forming a display unit on a substrate; forming a sealing structure on the substrate covering the display unit to seal the display unit, the sealing structure including: at least one first layer including an inorganic material; and at least one second layer including an organic material; and maintaining the sealing structure in an atmosphere of an identification material including a fluorescent substance or a dye.

The method may further include: irradiating the sealing structure of the flat panel display device.

Irradiating the sealing structure may further include irradiating the sealing structure with ultraviolet illumination.

The method may further include: identifying a micro gap by detecting the identification material when it is irradiated.

The sealing structure may be maintained in the atmosphere of the identification material at a high pressure or a normal pressure.

The method may further include: irradiating ultraviolet illumination onto the sealing structure of the flat panel display device.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION

Figure 1:
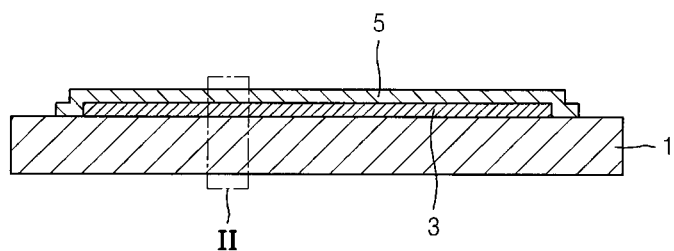
FIG. 1 is a schematic cross-sectional view illustrating a flat panel display device according to an exemplary embodiment of the present invention.

Hereinafter, exemplary embodiments of the present invention will be described in detail with reference to the accompanying drawings such that those skilled in the art may carry out the present invention. As those skilled in the art would realize, the described embodiments may be modified in various different ways, all without departing from the spirit or scope of the present invention.

To clearly describe the embodiments, parts not necessary to understanding the description may be omitted, and like reference numerals designate like elements throughout the specification. In the drawings, the sizes and thicknesses of the components are shown for convenience of explanation, and therefore may not be illustrated to scale. Also, when an element is referred to as being "coupled to" (e.g., electrically coupled or connected) or "on" another element, it may be directly "coupled to" or "on" the other element or one or more other elements may be interposed therebetween.

FIG. 1 is a schematic cross-sectional view illustrating a flat panel display device according to an exemplary embodiment of the present invention.

Referring to FIG. 1, the flat panel display device according to the present exemplary embodiment includes a display unit 3 that is on (e.g., formed on) a surface of a substrate 1 and includes a sealing structure 5 that seals the display unit 3.

The substrate 1 may be a transparent glass substrate, but it is not limited thereto. For example, the substrate 1 may be a flexible plastic substrate. If the flat panel display device is of a top emission type in which an image is realized in a direction of the sealing structure 5, the substrate 1 may be opaque. In this case, in addition to glass or plastic, the substrate 1 may be formed of a metal.

The display unit 3 is on the substrate 1 and may be an organic light-emitting display unit. The substrate 1 may include a circuit unit including thin film transistors (TFTs), and the circuit unit may be electrically connected to the display unit 3.

According to an embodiment, the sealing structure 5 is formed in a film shape to seal the display unit 3 from external moisture/oxygen. For this purpose, the sealing structure 5 may be formed on the display unit 4 with a wider area than the display unit 3 in order to cover the display unit 3.

Figure 2:
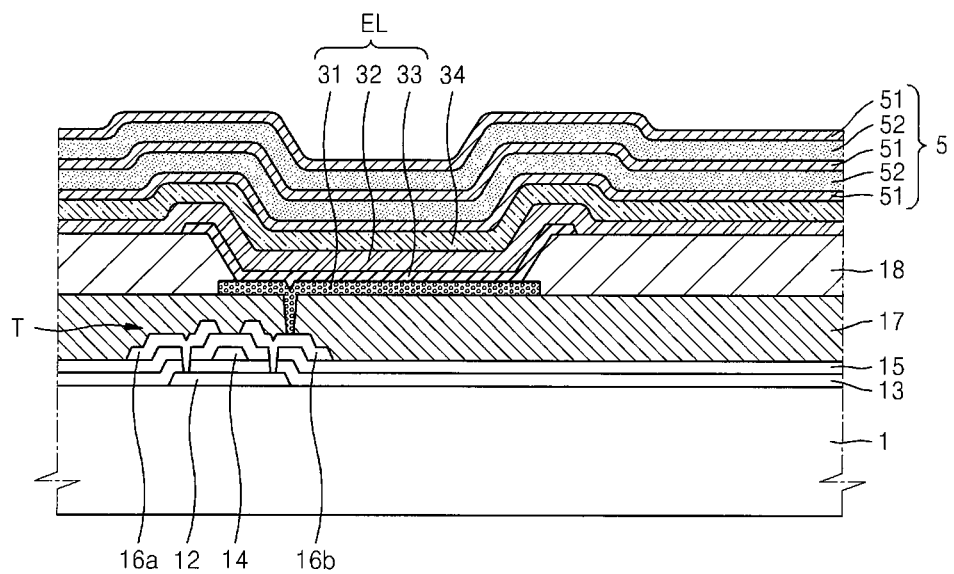
FIG. 2 is a detailed cross-sectional view of region II of FIG. 1, according to an exemplary embodiment of the present invention.
Figure 3:
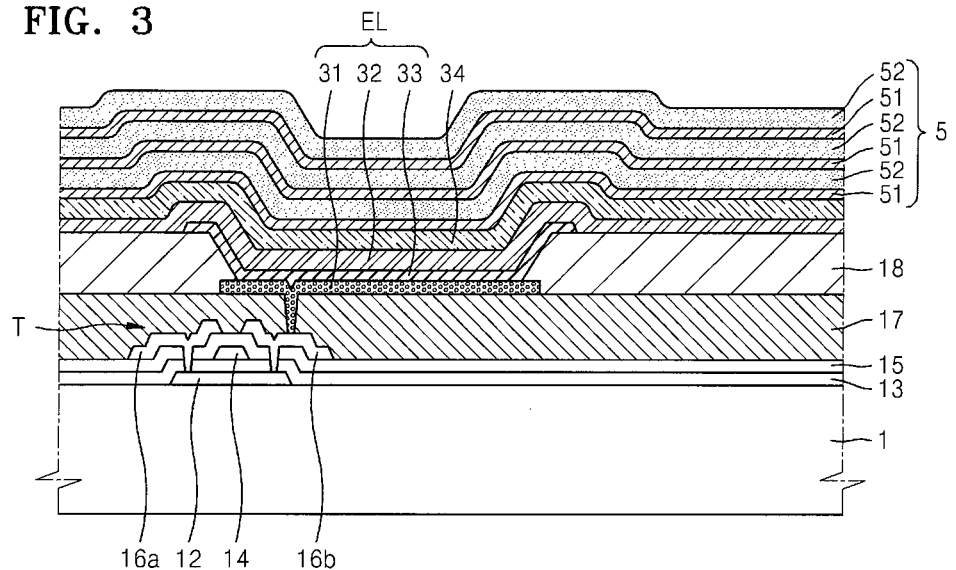
FIG. 3 is a detailed cross-sectional view of region II of FIG. 1, according to another exemplary embodiment of the present invention.

FIG. 2 is a detailed cross-sectional view illustrating enlarged part II of FIG. 1, i.e. illustrating one pixel of the display unit 3 of FIG. 3, according to an exemplary embodiment of the present invention.

Each pixel includes a pixel circuit unit, and the pixel circuit unit includes at least one TFT T and at least one capacitor (not shown).

A semiconductor active layer 12 is on (e.g., formed on) the substrate 1.

The semiconductor active layer 12 may be formed of amorphous/polycrystalline silicon but it is not limited thereto. For example, the semiconductor active layer 12 may be formed of an oxide semiconductor. For example, the semiconductor active layer 12 may be a G-I-Z-O layer [(In2O3)a(Ga2O3)b (ZnO)c], wherein a, b, and c are real numbers that meet the conditions of a≥0, b≥0, c>0.

A gate insulating layer 13 may be on (e.g., formed on) the substrate 1 to cover the semiconductor active layer 12, and a gate electrode 14 may be on (e.g., formed on) the gate insulating layer 13.

An interlayer insulating layer 15 may be on (e.g., formed on) the gate insulating layer 13 to cover the gate electrode 14. A source electrode 16a and a drain electrode 16b may be on the interlayer insulating layer 15 and respectively contact the semiconductor active layer 12 through contact holes.

A structure of a TFT T is not limited to that described above, and various types of TFT structures may be applied.

A first insulating layer 17 may be formed to cover the TFT T. The first insulating layer 17 may be a single or multi-insulating layer, an upper surface of which is planarized. The first insulating layer 17 may be formed of an inorganic and/or an organic material.

As shown in FIG. 2, a first electrode 31 of an organic light emitting device EL is on (e.g., formed on) the first insulating layer 17 and is coupled (e.g., electrically connected) to the TFT T. The first electrode 31 may be formed in an independent island shape in each pixel.

A second insulating layer 18 may be on (e.g., formed on) the first insulating layer 17 to cover an edge of the first electrode 31. A central part of the first electrode 31, i.e., not the edge of the first electrode 31, may be exposed through an opening formed in the second insulating layer 18. The second insulating layer 18 may be formed of an organic material, such as acryl, polyimide, or the like.

A second electrode 32 of the organic light emitting device EL is opposite to the first electrode 31 and is electrically insulated from the first electrode 31 by an organic emission layer 33. In an embodiment, at least the second electrode 32 may be formed as a common electrode to cover all the pixels, and the first electrode 31 may be formed as an independent structure in each pixel.

A first electrode material may be provided, for example, by using a deposition method or a sputtering method to form the first electrode 31 on the first insulating layer 17. If the first electrode 31 is an anode, the first electrode material may be selected from materials having high work functions. The first electrode 31 may be a reflective electrode, a transflective electrode, or a transmissive electrode. The first electrode material may be ITO, IZO, SnO2, ZnO, or the like that is transparent and has a high conductivity. The first electrode 31 may further include a reflective layer formed of Mg, Al, Al—Li, Ca, Mg—In, Mg—Ag, or the like.

The first electrode may have a single layer structure or a multilayer structure with two or more layers. For example, the first electrode 31 may be a three layer structure of ITO/Ag/ITO, but it is not limited thereto.

The organic emission layer 33 may be formed on the first electrode 31.

The organic emission layer 33 may include one or more of a hole injection layer (HIL), a hole transport layer (HTL), a functional layer having a hole injection function and a hole transport function, a buffer layer, an electronic blocking layer, an emission layer (EML), a hole blocking layer (HBL), an electron transport layer (ETL), and an electron injection layer (EIL).

For example, the organic emission layer 33 may include one or more of compounds 301, 311, and 321 shown below.

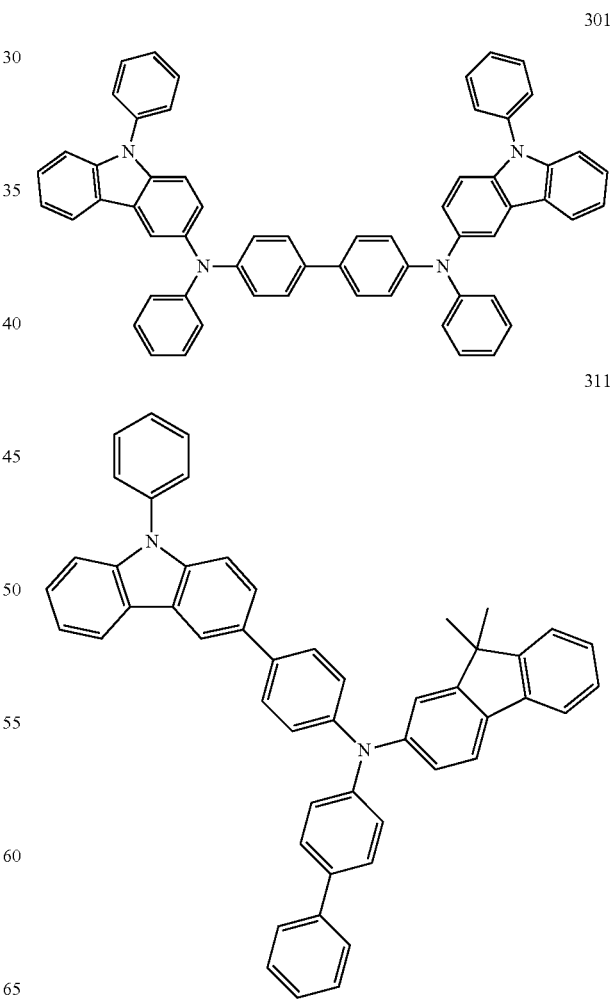

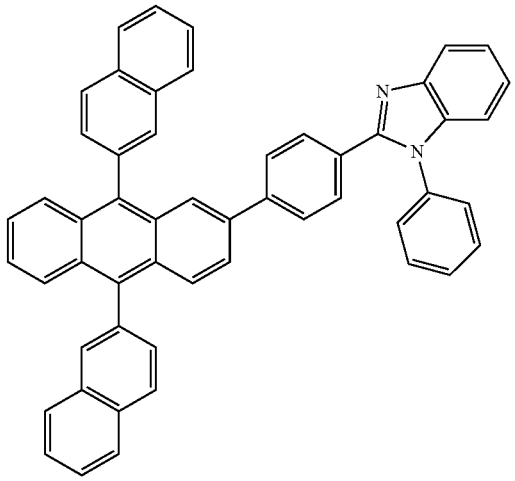

321

The second electrode 32 may be on (e.g., formed on) the organic emission layer 33. The second electrode 32 may be a cathode, which is an electron injection electrode. Here, a metal used for the second electrode 32 may be a metal having a low work function, for example an alloy, an electroconductive compound, or a combination thereof. Li, Mg, Al, Al—Li, Ca, Mg—In, Mg—Ag, or the like may be formed as a thin film to obtain a reflective, transflective, or transmissive electrode. A transmissive electrode may be formed by using ITO or IZO. Various modifications may be made to obtain a top emission type device.

If the flat panel display device is realized as a bottom emission type structure in which an image is realized in a direction of the substrate 1, a thickness of the second electrode 32 may be thickly formed to improve light-emission efficiency in the direction of the substrate 1.

If the flat panel display device is realized as a top emission type structure in which an image is realized in a direction of the second electrode 32, the thickness of the second electrode 32 may be thinly formed to form the second electrode 32 as a transflective layer, or the second electrode 32 may be formed of a transparent conductor besides the above-described materials. In this case, the first electrode 31 may further include a reflective layer.

A protective layer 34 may be formed on the second electrode 32. The protective layer 34 prevents the second electrode 32 from being damaged. For example, the protective layer 34 may be formed of LiF, lithium quinolate, Alq$_3$, or the like.

According to an embodiment, the sealing structure 5 is formed on the protective layer 34. The sealing structure 5 may include a plurality of first layers 51 and a plurality of second layers 52.

Here, the sealing structure 5 includes at least one first layer 51 and at least one second layer 52. The first layer 51 includes an inorganic material, and the second layer 52 includes an organic material.

The inorganic material may include one or more of silicon oxide, silicon nitride, silicon oxynitride, aluminum oxide, aluminum nitride, aluminum oxynitride, tin oxide, phosphorous oxide, boron phosphate, tin fluoride, niobium oxide, and tungsten oxide, but it is not limited thereto.

The organic material may include acryl or polyimide, but it is not limited thereto.

The first and second layers 51 and 52 may be alternately formed. In FIG. 2, three first layers 51 are formed, and the second layers 52 are interposed between the first layers 51, but the present invention is not limited thereto. In other embodiments, the number of first layers 51 and second layers 52 may differ.

In the exemplary embodiment of FIG. 2, the first layer 51, including the inorganic material, forms an outermost surface of the sealing structure 5. However, the present invention is not limited thereto, and the second layer 52, including the organic material, may form an outermost surface of the sealing structure 5, as shown in FIG. 3. In this case, the outermost surface of the sealing structure 5 may be planarized due to a planarization characteristic of the organic material.

Figure 4:
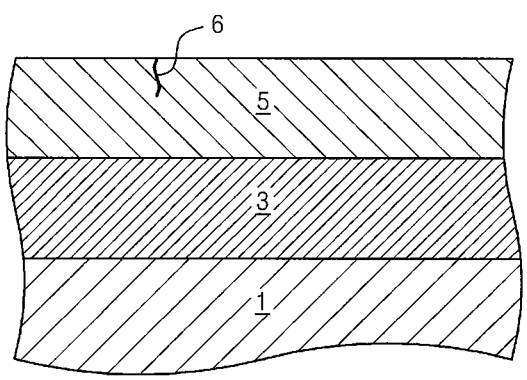
FIG. 4 is a schematic cross-sectional view illustrating an enlarged part of the flat panel display device of FIG. 1.

As shown in FIG. 4, the sealing structure 5 may include a micro gap 6. According to an embodiment, the micro gap 6 includes an identification material having a fluorescent substance or a dye. The fluorescent substance or the dye may generally be a material that identifies (or exhibits) a color through external illumination. The fluorescent substance or the dye may be any material that may be identified when electromagnetic radiation (e.g., ultraviolet illumination) is irradiated on to it, as described later. The micro gap 6 may be filled with the identification material.

The micro gap 6 may be very small, for example a gap of several micrometers or less, which is not observable with the naked eye. The micro gap 6 may be formed due to particles or defects in a process of forming the sealing structure 5.

The micro gap 6 may be in an outermost surface of the sealing structure 5.

Accordingly, if the outermost surface of the sealing structure 5 is the first layer 51 including the inorganic material, as shown in FIG. 2, the micro gap 6 may be formed in the first layer 51. If the outermost surface of the sealing structure 5 is the second layer 52, including the organic material, as shown in FIG. 3, the micro gap 6 may be formed in the second layer 52. Although not shown in the drawings, the micro gap 6 may be formed in both of the first and second layers 51 and 52 constituting the outermost surface of the sealing structure 5.

Figure 5:
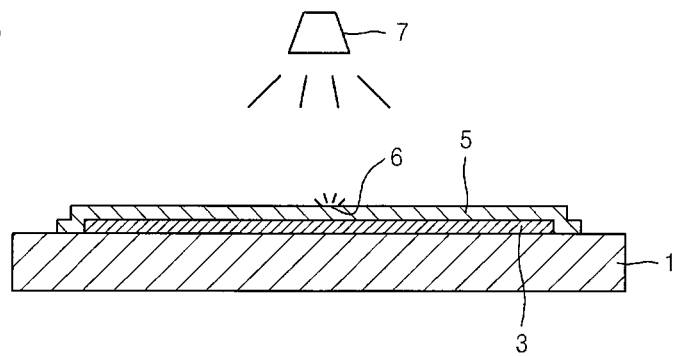
FIG. 5 is a cross-sectional view illustrating a method of manufacturing a flat panel display device according to an exemplary embodiment of the present invention.

In the present exemplary embodiment, the micro gap 6, including the identification material, is in the sealing structure 5. As shown in FIG. 5, an ultraviolet illumination 7 may be irradiated onto the flat panel display device, and accordingly, an existence or a nonexistence and a position of the micro gap 6 may be easily identified. Therefore, a degree of the micro gap 6 may be easily checked, and whether a defect occurs in the flat panel display device may be determined.

A method of manufacturing a flat panel display device, according to an exemplary embodiment of the present invention, will now be described with reference to the attached drawings.

As shown in FIG. 1, the display unit 3 is formed on the substrate 1.

As shown in FIGS. 2 and 3, the display unit 3 may include a plurality of pixels.

The semiconductor active layer 12 is formed on the substrate 1.

The gate insulating layer 13 may be formed on the substrate 1 to cover the semiconductor active layer 12, and the gate electrode 14 may be formed on the gate insulating layer 13.

The interlayer insulating layer 15 may be formed on the gate insulating layer 13 to cover the gate electrode 14. The source electrode 16a and the drain electrode 16b may be formed on the interlayer insulating layer 15 to contact the semiconductor active layer 12 through contact holes.

The first insulating layer 17 may be formed to cover the TFT T. The first insulating layer 17 may be a single or multi-insulating layer, the upper surface of which is planarized. The first insulating layer 17 may be formed of the inorganic material and/or the organic material.

As shown in FIG. 2, the first electrode 31 may be formed on the first insulating layer 17 and may be coupled (e.g., electrically connected) to the TFT T. The first electrode 31 may be formed in the independent island shape in each pixel. The first electrode material may be formed on the first insulating layer 17 by using a deposition method or a sputtering method to form the first electrode 31.

The second insulating layer 18 may be formed on the first insulating layer 17 to cover the edge of the first electrode 31. An opening may be formed in the second insulating layer 18 to expose the central part of the first electrode 31 and not the edge of the first electrode 31.

The organic emission layer 33 may be formed on the first electrode 31, which is exposed through the opening. The organic emission layer 33 may be also formed on the second insulating layer 18

The second electrode 32 may be formed to cover the organic emission layer 33. The second electrode 32 may be formed as the common electrode to cover all the pixels.

If the flat panel display device is realized as a bottom emission type in which an image is realized in the direction of the substrate 1 as described above, the thickness of the second electrode 32 may be thickly formed to improve the light-emission efficiency in the direction of the substrate 1.

If the flat panel display device is realized as a top emission type in which an image is realized in the direction of the second electrode 32, the thickness of the second electrode 32 may be thinly formed to form the second electrode 32 as a transflective layer or to form the second electrode 32 of a transparent conductor. In this case, the first electrode 31 may further include a reflective layer.

The protective layer 34 may be formed to cover the second electrode 32. For example, the protective layer 34 may be formed of LiF, lithium quinolate, $Alq_3$, or the like.

According to an embodiment, the sealing structure 5, including the plurality of first layers 51 and the plurality of second layers 52, is formed on the protective layer 34. The first layer 51 includes an inorganic material, and the second layer 52 includes an organic material.

The inorganic material may include one or more of silicon oxide, silicon nitride, silicon oxynitride, aluminum oxide, aluminum nitride, aluminum oxynitride, tin oxide, phosphorous oxide, boron phosphate, tin fluoride, niobium oxide, and tungsten oxide but it is not limited thereto.

The organic material may include acryl or polyimide but it is not limited thereto.

The first and second layers 51 and 52 may be alternately formed.

According to an embodiment, the flat panel display device, as described above, is maintained in an atmosphere (or environment) of an identification material, for example including a fluorescent substance or dye.

According to an embodiment, at least the sealing structure 5 may be maintained in the atmosphere of an identification material.

The flat panel display device may be maintained in the atmosphere of the identification material under a condition of high pressure or normal pressure.

Because the flat panel display device is maintained in the atmosphere of the identification material as described above, the identification material may permeate into a micro gap 6 in the sealing structure 5, as shown in FIG. 3

As shown in FIG. 5, ultraviolet illumination 7 is irradiated onto at least the sealing structure 5 of the flat panel display device.

In this case, if the micro gap 6, including the identification material, is in the sealing structure 5. The identification material that is included in the micro gap 6 and includes the fluorescent substance or the dye may be observed. Accordingly, an observer determines the existence or the nonexistence of the micro gap 6.

Generally, a micro gap 6 may form in a process of forming the sealing structure 5. This is because the process of forming the sealing structure 5 may not be performed under perfect conditions. According to embodiments of the present invention, the existence and the state of a micro gap 6 may be easily observed. Therefore, whether the flat panel display device has a defect may be easily determined.

In the above-described exemplary embodiment, only the sealing structure 5 is formed as a sealing structure of the flat panel display device. However, the present invention is not limited thereto, for example, a sealing structure that further includes a sealing substrate outside the sealing structure 5 to be bonded to the substrate 1 in order to further protect the display unit 3 from external moisture/oxygen may be applied.

As described above, according to the present invention, when a micro gap is formed in a sealing structure, it includes an identification material, and thus, an existence or a nonexistence and a state of the micro gap is easily identified.

Therefore, whether a defect has occurred in a flat panel display device is easily determined.

The micro gap may be formed in a process of forming the sealing structure. Even if the micro gap is formed as described, the existence and the state of the micro gap is easily observed, and thus whether the defect has occurred in the flat panel display device is easily determined.

While the present invention has been particularly shown and described with reference to exemplary embodiments thereof, it will be understood by those of ordinary skill in the art that various changes in form and details may be made therein without departing from the spirit and scope of the present invention as defined by the following claims and their equivalents.

What is claimed is:

1. A flat panel display device comprising:
   a display unit on a substrate, the display unit comprising:
      an organic light emitting device; and
      a protective layer on the organic light emitting device and on an area adjacent to the organic light emitting device, the protective layer comprising a material selected from the group consisting of LiF, lithium quinolate, and $Alq_3$, and
   a sealing structure on the substrate covering the display unit to seal the display unit, the sealing structure comprising:
      at least two first layers comprising an inorganic material; and
      at least one second layer comprising an organic material, the sealing structure:
      being directly on the protective layer over the organic light emitting device and over the area adjacent to the organic light emitting device, and
      having a same number of layers, continuously deposited, over the organic light emitting device and over the area adjacent to the organic light emitting device,
      wherein the at least two first layers comprising an inorganic material are at a lowest part and at an outmost part of the sealing structure.

2. The flat panel display device of claim 1, wherein the at least one second layer is disposed between the at least two first layers.

* * * * *